(12) United States Patent
Christensen et al.

(10) Patent No.: US 8,531,203 B2
(45) Date of Patent: Sep. 10, 2013

(54) MASK ALIGNMENT, ROTATION AND BIAS MONITOR UTILIZING THRESHOLD VOLTAGE DEPENDENCE

(75) Inventors: Todd A. Christensen, Rochester, MN (US); Matthew J. Paschal, Rochester, MN (US); John E. Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 517 days.

(21) Appl. No.: 12/813,804

(22) Filed: Jun. 11, 2010

(65) Prior Publication Data

US 2011/0304350 A1    Dec. 15, 2011

(51) Int. Cl.
*G01R 31/26*    (2006.01)

(52) U.S. Cl.
USPC ..................................... 324/762.09

(58) Field of Classification Search
USPC ................. 324/762.01–762.1, 750.01–750.3, 324/754.01–754.3, 755.01–755.1; 257/48; 438/14–18

See application file for complete search history.

(56) References Cited

U.S. PATENT DOCUMENTS

| | | | |
|---|---|---|---|
| 6,027,978 A * | 2/2000 | Gardner et al. | 438/289 |
| 6,465,305 B1 * | 10/2002 | Look et al. | 438/275 |
| 7,122,388 B2 | 10/2006 | Han | |
| 2010/0207182 A1 | 8/2010 | Paschal | |

* cited by examiner

*Primary Examiner* — Tung X Nguyen
(74) *Attorney, Agent, or Firm* — Matthew J. Bussan

(57) ABSTRACT

The present invention provides a method and apparatus for measuring alignment, rotation and bias of mask layers in semiconductor manufacturing by examining threshold voltage variation.

20 Claims, 10 Drawing Sheets

Implant Mask Misaligned Left

Implant Mask Misaligned Down

Undersized Implant Mask

Oversized Implant Mask

Mask Aligned

Mask Rotated

MASK ALIGNMENT, ROTATION AND BIAS MONITOR UTILIZING THRESHOLD VOLTAGE DEPENDENCE

BACKGROUND

1. Field of the Invention

The field of invention relates to detecting misaligned electrical masks in the semiconductor manufacturing process. In particular, the field of invention relates to measuring alignment, rotation, and bias of mask layers in semiconductor manufacturing by examining threshold voltage variation in devices defined by the mask layers.

2. Description of the Related Art

Semiconductor manufacturers produce a number of types of computer chips, including dynamic random access memory chips (DRAMs), microprocessors, application specific integrated circuits (ASICs), and digital signal processors, for example. Although the process for manufacturing these computer chips, also referred to as integrated circuits (IC), may vary depending on the type of chip, all include some fundamental manufacturing process steps such as deposition, photolithography, etching, ion implantation, polishing, cleaning, and drying, for example.

Often, throughout the semiconductor manufacturing process, repeated use is made of masks for creating multiple layers of circuit patterns on a chip. In particular, the process includes creating multiple layers (hereinafter "level") by transferring a pattern from a mask to a light sensitive material, known in the art as a photoresist, on a substrate. In high yield semiconductor manufacturing processes it is especially crucial that the various mask levels that are transferred onto the photoresist be within specification such that it is aligned, without rotation, and without bias (i.e., oversized or undersized).

Typically, alignment is performed using physical techniques such as optical structures that are read by persons or read by pattern recognition software and tools using misalignment verniers, "box inside a box" optical reflection techniques or other manual comparative assessments. Although some masking levels result in structures that are still visible during the subsequent processing steps, many mask levels do not leave any visible physical structure behind. The most common of these are ion implant mask levels. Ion implantation is a materials engineering process whereby ions of a material can be implanted into the silicon wafer to change the physical properties of the silicon wafer. Often, for the ion implant mask levels, a layer of photoresist is applied, light is exposed through the mask, and subsequently developed to open the desired images. Next, this masked wafer is ion implanted, wherein the photoresist is used to control the areas where ions are implanted before the photoresist is chemically stripped away. Thus, the alignment of the ion implant mask is crucial in determining the areas that are implanted with ions, but difficult to determine through traditional techniques.

Current alignment measurement techniques suffer from several limitations. First, measurement of the alignment, rotation and bias of the mask often has to be done with the photoresist still in place since after the photoresist is removed there is no optically or electrically visible evidence remaining of the ion implant. Second, alternatives to physical alignment techniques, such as electrical alignment techniques fail to apply to lightly doped implants such as threshold tailoring implants, for example. Thus, there exists a need to measure the ion implant mask alignment, rotation, and bias of these masks after the wafers are fully processed and that apply to lightly doped implants.

SUMMARY

The present invention provides an apparatus and method for detecting ion implant mask misalignment, rotation and bias in a semiconductor manufacturing process. In one embodiment, the apparatus comprises at least two field effect transistor (FET) pairs. The apparatus further includes an ion implanted area in each FET included in the at least two FET pairs. The apparatus also includes at least one inspection unit configured to measure the threshold voltage of each FET included in the at least two FET pairs.

In one embodiment, at least one inspection unit is further configured to compare the measured threshold voltage of each FET included in at least two FET pairs against a known reference threshold voltage. In one instance, at least one inspection unit is configured to provide an indication of an undersized mask bias error when the measured threshold voltage of each FET included in at least two FET pairs is smaller than the known reference threshold voltage. In a similar manner, at least one inspection unit is configured to provide an indication of an oversized mask bias error when the measured threshold voltage of each FET included in at least two FET pairs is larger than the known reference threshold voltage In another embodiment of the present invention, the inspection unit is configured to compare the measured threshold voltage of each FET from at least two FET pairs against each other. In one embodiment, the inspection unit is configured to provide an indication of a vertical mask alignment error when at least one FET pair is vertically aligned, and when the measured threshold voltage of at least two of the FETs within the aligned FET pair is different. Similarly, the inspection unit may also be configured to provide an indication of a horizontal mask alignment error when at least one FET pair is horizontally aligned, and when the measured threshold voltage of at least two of the FETs within the aligned FET pair is different.

In yet another embodiment of the present invention, an inspection unit is positioned at each corner of a mask reticle, wherein each of the inspection units is configured to measure mask alignment errors. In one embodiment, the apparatus analyzes the direction of alignment errors provided by at least one inspection unit in order to determine a mask rotation error, and the direction of the mask rotation.

The present invention also provides a method for detecting ion implant mask misalignment, rotation and bias errors in semiconductor fabrication, wherein the method includes the step of positioning at least one mask alignment, rotation and bias (MARB) measurement unit having at least two field effect transistor (FET) pairs during semiconductor manufacturing such that a gate region within each FET receives ion dopants from an ion implant process. The method further includes the step of measuring, via an inspection unit within the MARB, threshold voltages of each FET included in the at least two FET pairs.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Figure 1:
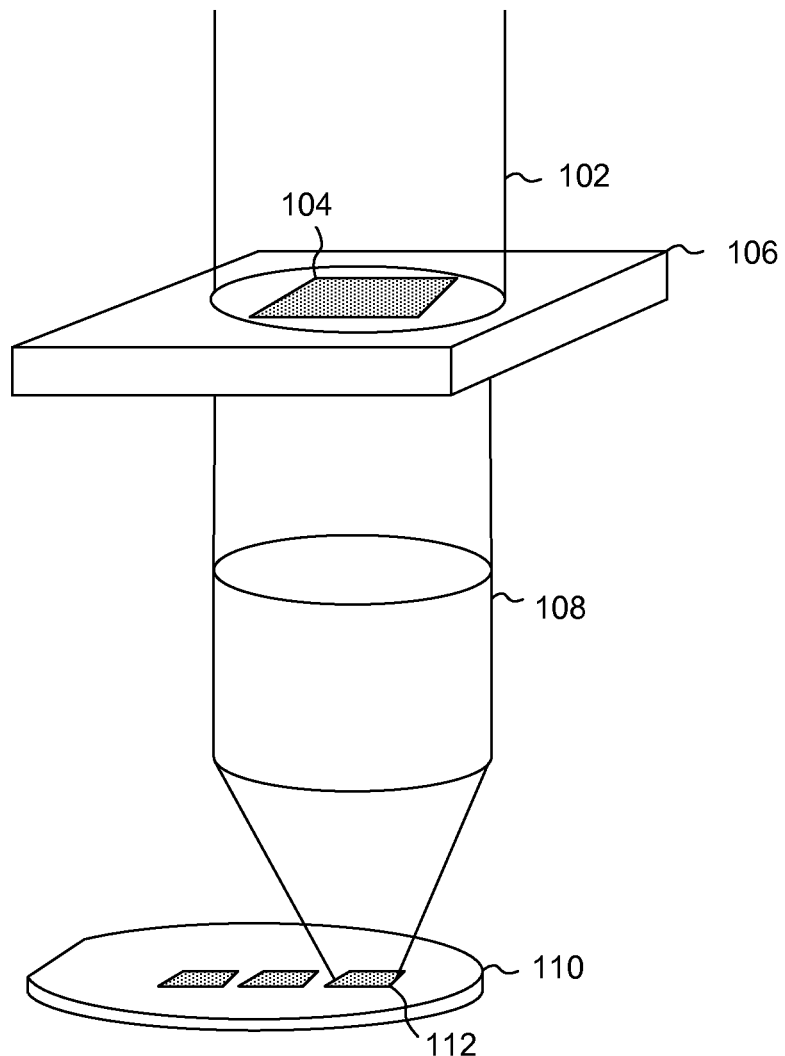
FIG. 1 (Prior Art) illustrates a known photolithography technique for creating multiple layers of circuit patterns on a chip.

FIG. 1 (Prior Art) illustrates a known photolithography technique for creating multiple layers of circuit patterns on a chip. In particular, FIG. 1 shows a photoresist coated substrate 110. The photoresist coated substrate 110 is exposed to a UV light 102 shown through a reticle 106 with a mask pattern 104. The mask pattern 104 is larger than the final pattern 112 projected on substrate 110 and is reduced by a reduction lens 108 before exposing the photresist coated substrate 110.

Figure 2:
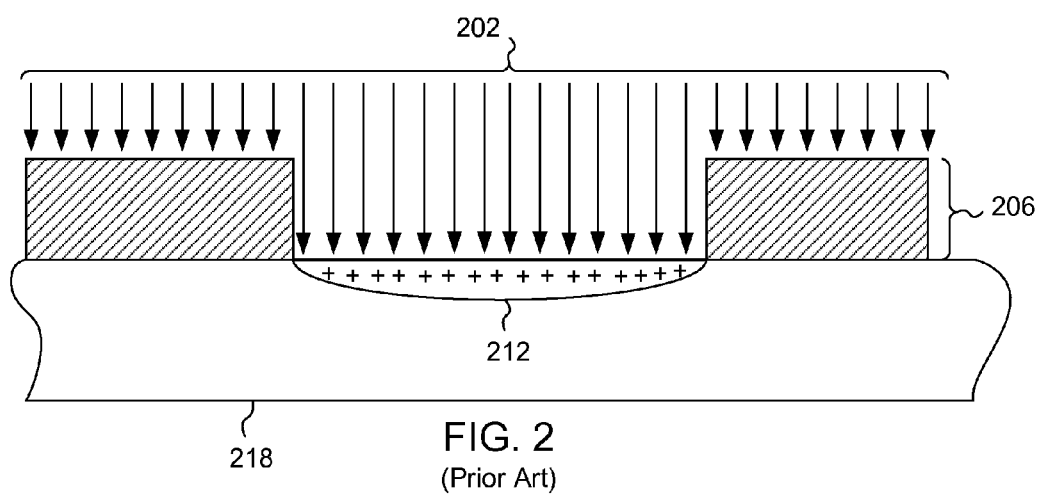
FIG. 2 (Prior Art) illustrates a view of a silicon wafer undergoing ion implantation as known in the art.

FIG. 2 (Prior Art) illustrates a view of a silicon wafer undergoing a light threshold voltage tailor implant as known in the art. FIG. 2 shows the different layers of the circuit including a lightly doped P-silicon wafer 218, and a photoresist region 206 formed on the wafer. Lightly doped P-silicon wafer 218 is implanted with dopants via an ion implantation doping process 202. As shown, photoresist 206 prevents ion implantation of those regions of lightly doped P-silicon wafer 218 covered by the photoresist. In those regions of lightly doped P-silicon wafer 218 not covered by the photoresist, a lightly doped ion implant area 212 is created.

Figure 3A:
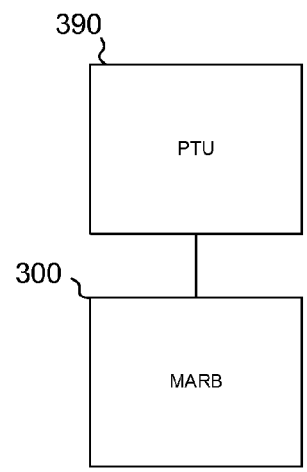
FIGS. 3A-3B illustrate a general and detailed view of a mask alignment, rotation and bias measurement unit.
Figure 3B:
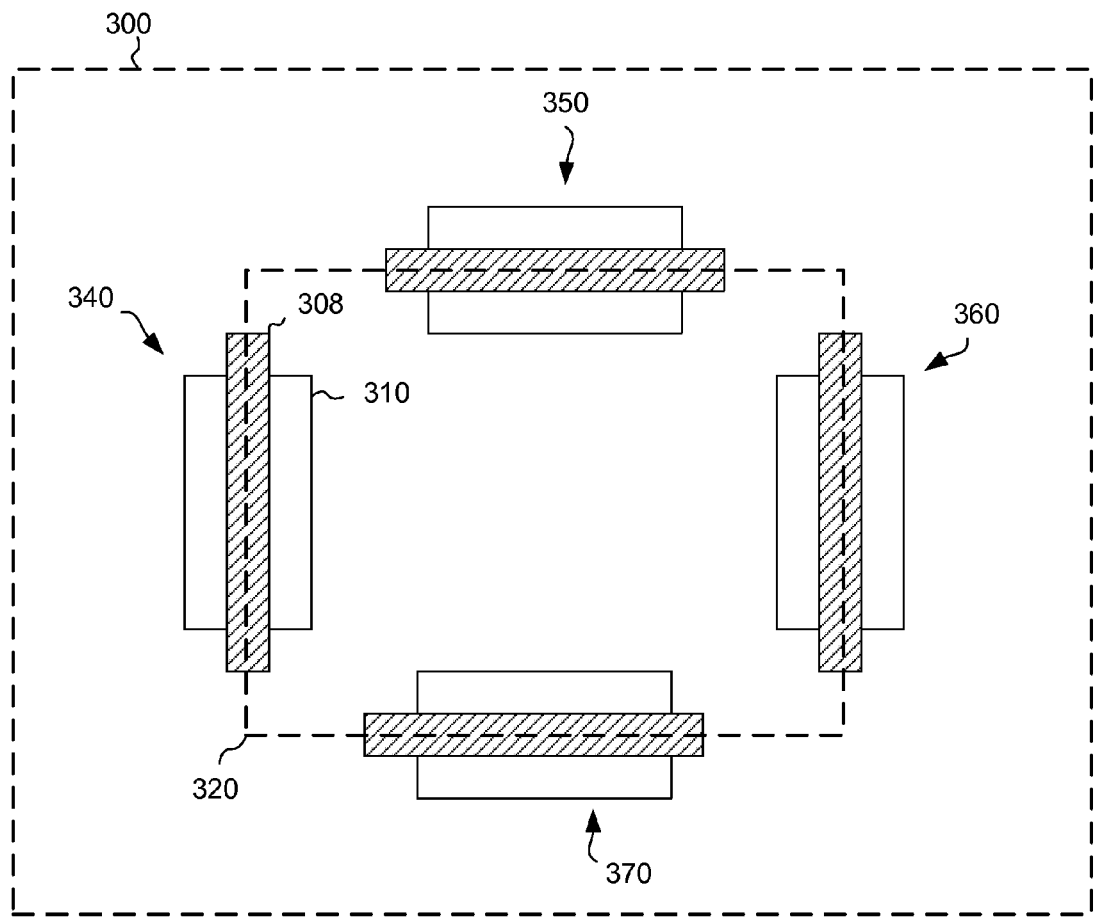

FIG. 3A illustrates a general view of one embodiment of a mask alignment, rotation and bias (MARB) measurement unit 300 coupled to a parametric test unit (PTU) 390. FIG. 3B illustrates a detailed embodiment of the MARB measurement unit 300. The embodiment includes two sets of paired field effect transistors (FET) including a first pair to measure vertical (up/down) alignment (350 and 370) and a second pair to measure horizontal (left/right) alignment (340 and 360). In alternate embodiments, additional FETs make be positioned around the periphery of the mask without departing from the scope and spirit of the present invention.

MARB measurement unit 300 is positioned such that the area exposed during the ion implant process overlaps a portion of gate region 308 of each FET instance. In particular, the MARB measurement unit 300 is overlaid with an ion implant mask 320 that opens an image that, once developed, exposes the sections of each FET within the ion implant mask 320. The exposed sections, including an interior source/drain region 310 of each FET and the gate region 308 as previously noted, receive ion dopants that impact the operation of each FET instance. Specifically, the ion dopants in the gate region 308 alter the threshold voltage of the FET. Differing ion dopants may be employed in accordance with the present invention which may either raise or lower the threshold voltage of the gate regions within each FET. For the purposes of illustration, the embodiment described herein utilizes a light P dopant for the ion implant process which effectively raises the threshold voltage of the FET. The PTU 390 coupled to the MARB measurement unit 300 compares the threshold voltage results across the FET instances with threshold voltage results of a perfectly aligned ion implant process. Based on the variations in threshold voltages across FET instances the PTU 390 is configured to determine misalignment and bias.

Figure 4A:
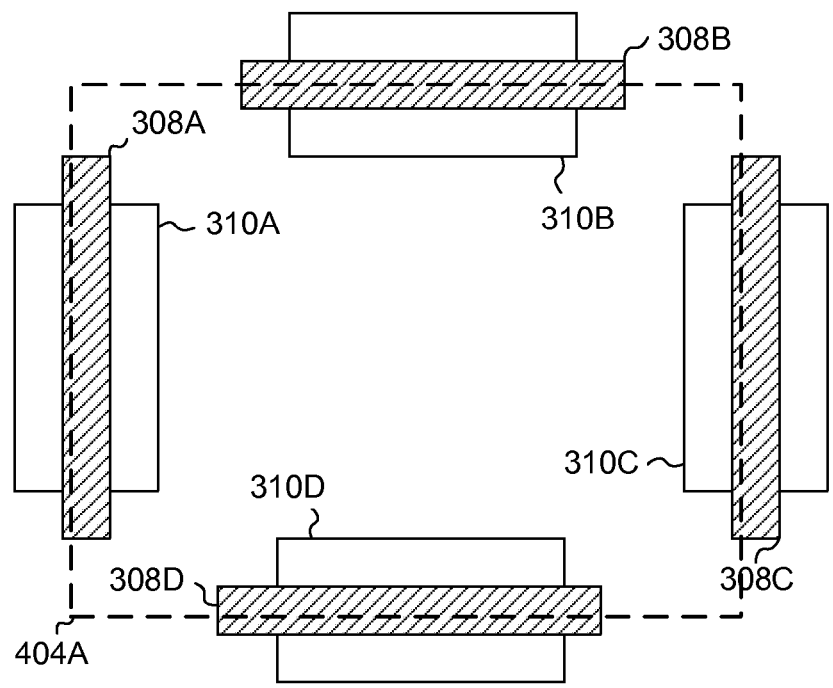
FIGS. 4A-4D illustrate examples of the mask alignment, rotation and bias measurement unit illustrated in FIGS. 3A-3B with varied misaligned and biased mask overlays.

FIGS. 4A-4D illustrate examples of the mask alignment, rotation and bias measurement unit illustrated in FIG. 3 with varied misaligned and biased mask overlays. FIG. 4A shows a horizontally misaligned mask. In this instance, mask 404A is shifted horizontally to the left, such that gate region 308C in gate 310C receives a relatively higher amount of ion dopants than the perfectly aligned gate of FET 360 shown in FIG. 3B, since only a small portion of the mask covers gate region 308C during the implant process. In contrast, gate region 308A in gate 310A receives a relatively lower amount of ion dopants, since gate region 308A is mostly masked from receiving ion dopants during the implant process (i.e., only a very small region at the leftmost edge of gate 308A is unmasked and will receive ion dopants. The increased amount of ion dopants received in gate region 308C relative to the perfectly aligned gate of FET 360 in FIG. 3B raises the voltage threshold of gate 310C relative to the voltage threshold of a normally aligned gate, and the decreased amount of ion dopants received in gate region 308A relative to the perfectly aligned gate of FET 310 in FIG. 3B lowers the voltage threshold of gate 310A. This is an indication to PTU 390 that the mask is misaligned to the left. By way of contrast, vertically aligned gate regions 308B and 308D receive an equivalent amount of ion dopants, since in both instances mask 404A bisects the gate regions. Thus, the vertical mask alignment is perfect, in this instance. As long as the mask (either aligned or misaligned) remains positioned somewhere within the gate regions 308A and 308C, the degree of misalignment can be directly determined by the corresponding voltage threshold change in the gate, as compared to the voltage threshold of the perfectly aligned gate of FIG. 3B.

Figure 4B:
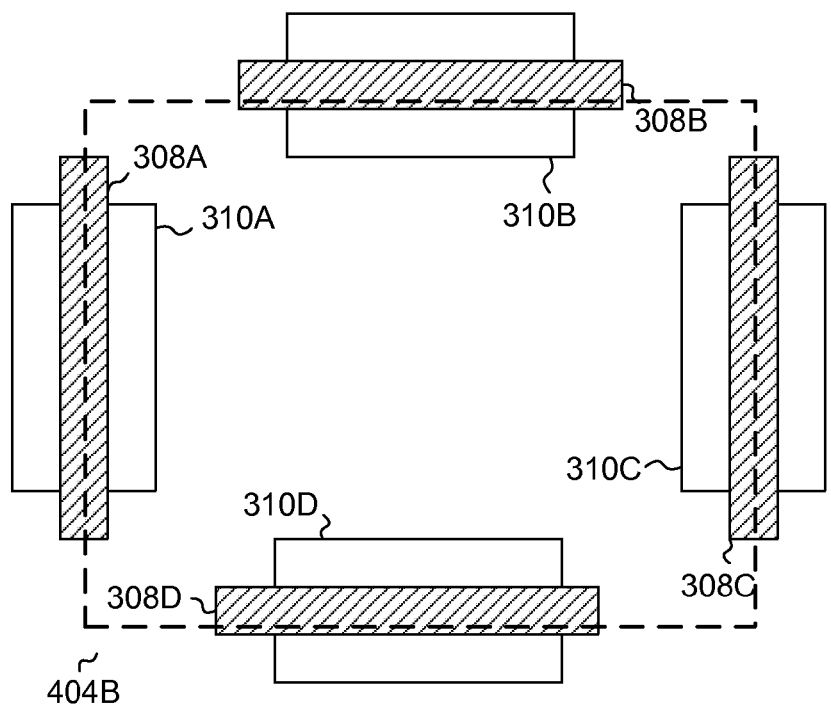

FIG. 4B shows a vertically misaligned mask. In this instance, mask 404B is shifted vertically downward, such that gate region 308B in gate 310B receives a relatively higher amount of ion dopants compared to the normally aligned gate of FET 350 shown in FIG. 3B, since only a small portion of the mask covers gate region 308B during the implant process. In contrast, gate region 308D in gate 310D receives a relatively lower amount of ion dopants, since gate region 308D is almost completely masked from receiving ion dopants during the implant process. The increased amount of ion dopants received in gate region 308B relative to the perfectly aligned gate of FET 310 in FIG. 3B raises the voltage threshold of gate 310B, and the decreased amount of ion dopants received in gate region 308D relative to the perfectly aligned gate of FET 310 in FIG. 3B lowers the voltage threshold of gate 310D. This is an indication to PTU 390 that the mask is misaligned vertically downward. By way of contrast, horizontally aligned gate regions 308A and 308C receive an equivalent amount of ion dopants, since in both instances mask 404A bisects the gate regions. Thus, the horizontal mask alignment is perfect, in this instance. As long as the mask (either aligned or misaligned) remains positioned somewhere within the gate regions 308B and 308D, the degree of misalignment can be directly determined by the corresponding voltage threshold change in the gate, as compared to the voltage threshold of the perfectly aligned gate of FIG. 3B.

Figure 4C:
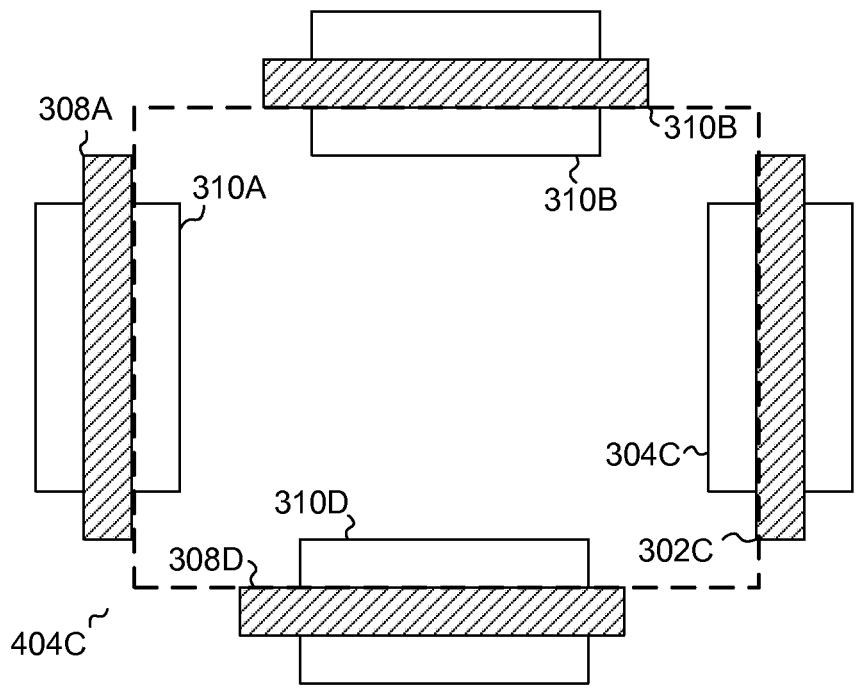

FIG. 4C shows a biased mask, wherein the mask is undersized. As a result, all gate regions, 308A-308D, receive an increased amount of ion dopants and consequently the threshold voltage across all gates is increased. PTU 390 is configured to interpret the increased voltage across all gates as compared to a known reference voltage as an indication of an undersized mask. In one embodiment, the known reference voltage may be predefined. In another embodiment, the known reference voltage is measured from a reference FET (i.e., a FET positioned in an area of the semiconductor where no mask bias error can come into play).

Figure 4D:
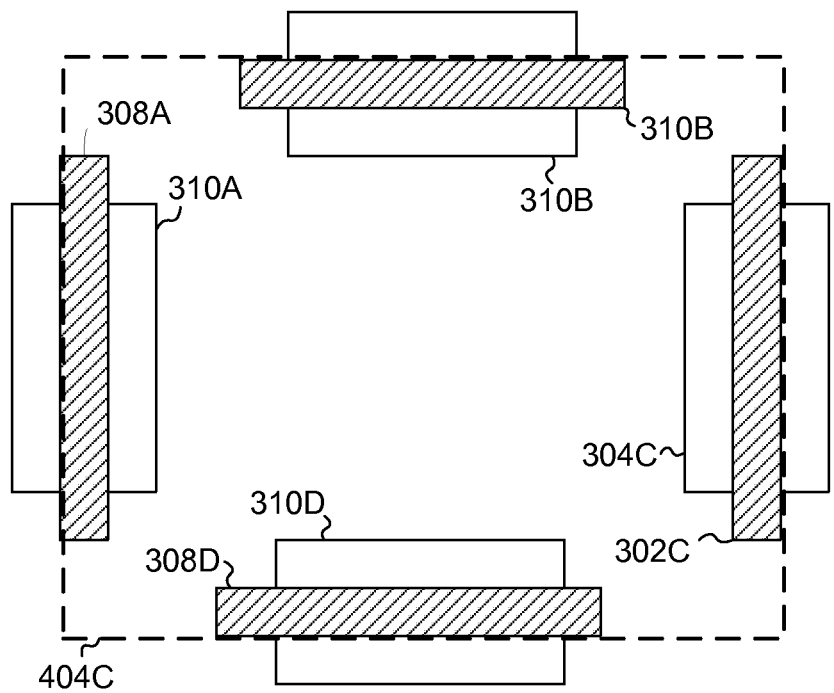

FIG. 4D shows a biased mask, wherein the mask is oversized. As a result, all gate regions, 308A-308D, receive a decreased amount of ion dopants and consequently the threshold voltage across all gates is decreased. PTU 390 is configured to interpret the decreased voltage across all gates as compared to a known reference voltage as an indication of an oversized mask. In one embodiment, the known reference voltage may be predefined. In another embodiment, the known reference voltage is measured from a reference FET (i.e., a FET positioned in an area of the semiconductor where no mask bias error can come into play).

Figure 5A:
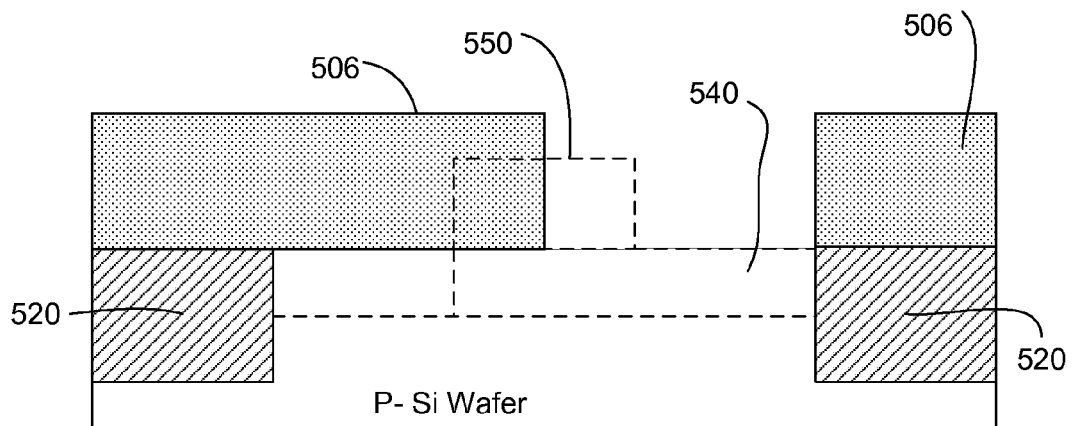
FIGS. 5A-5F illustrate cross-section views of a FET in the MARB measurement unit described in FIGS. 3A-3B.

FIGS. 5A-5F illustrate cross-section views of a FET in the MARB measurement unit described in FIGS. 3A-3B. In particular, FIG. 5A shows a P-silicon wafer 510 having a plurality of recessed shallow trench isolation (STI) regions 520. STI regions 520 provide gate isolation between FETs. The P-silicon wafer 510 is covered with a photoresist 506, effectively creating an ion implant mask region. Photoresist can be created by either a positive or negative mask process. Within the P-silicon wafer 510, a future source, drain and body area 540 is defined between the STI regions 520, and a future gate electrode and gate dielectric region 550 is defined on top of the future source, drain and body area 540. Thus a portion of the future source, drain and body area 540 and a portion of the future gate electrode and gate dielectric area 550 will be exposed to a subsequent ion implant process, further described in FIG. 5B.

Figure 5B:
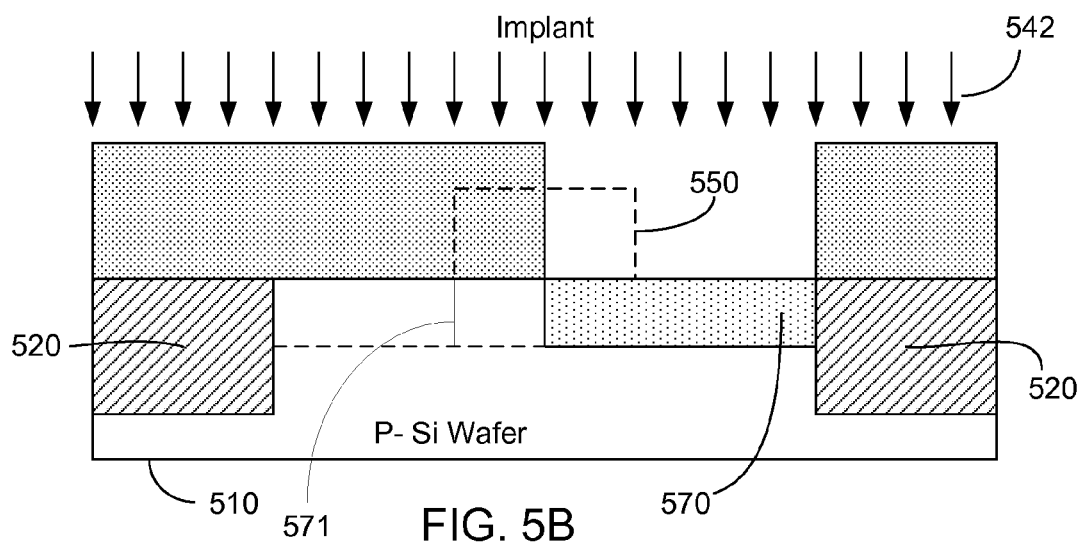

FIG. 5B shows an ion implant process step, wherein a VT tailor implant of light P dopants are dispersed on the top surface of the photoresist 506, and the non-photoresist covered portions of the P-silicon wafer 510. The photoresist 506 will prevent the light implant of P dopants from reaching covered portions of the P-silicon wafer 510, whereas the light dopants will be implanted in areas of the silicon wafer 510 not covered by the photoresist, creating a modified P-area 570. A portion of the area within the future source, drain and body area 540 is masked from the light implant of P dopants, leaving an unmodified P-area 571.

Figure 5C:
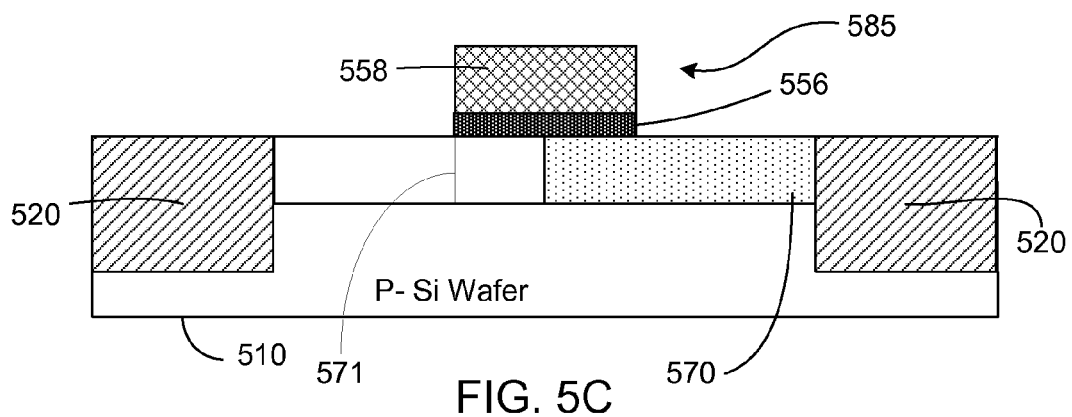

In FIG. 5C a FET gate 585 is formed over a portion of the modified P-area 570 and the unmodified P-area 571, the FET gate 585 comprising a gate dielectric region 556 and a gate electrode 558. FIG. 5C is illustrative of a gate formed over a perfectly aligned modified P-area 570. In this embodiment, approximately half of the area under the gate 585 is modified P-area 570, and approximately half of the area under the gate 585 is unmodified P-area 571.

Figure 5D:
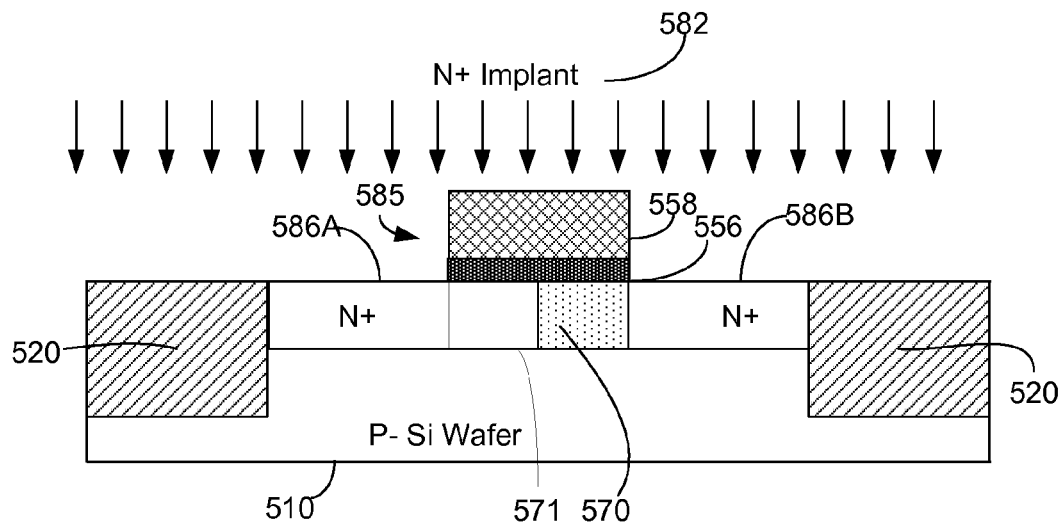

FIG. 5D illustrates an N+ implant process step 582 performed over the perfectly aligned FET of FIG. 5C. In the example, N+ regions 586A and 586B are created on the P-silicon wafer 510 directly adjacent to the gate area 585. Gate electrode 558 serves as a mask to that the N+ implant does not affect the remaining modified P-area 570.

Figure 5E:
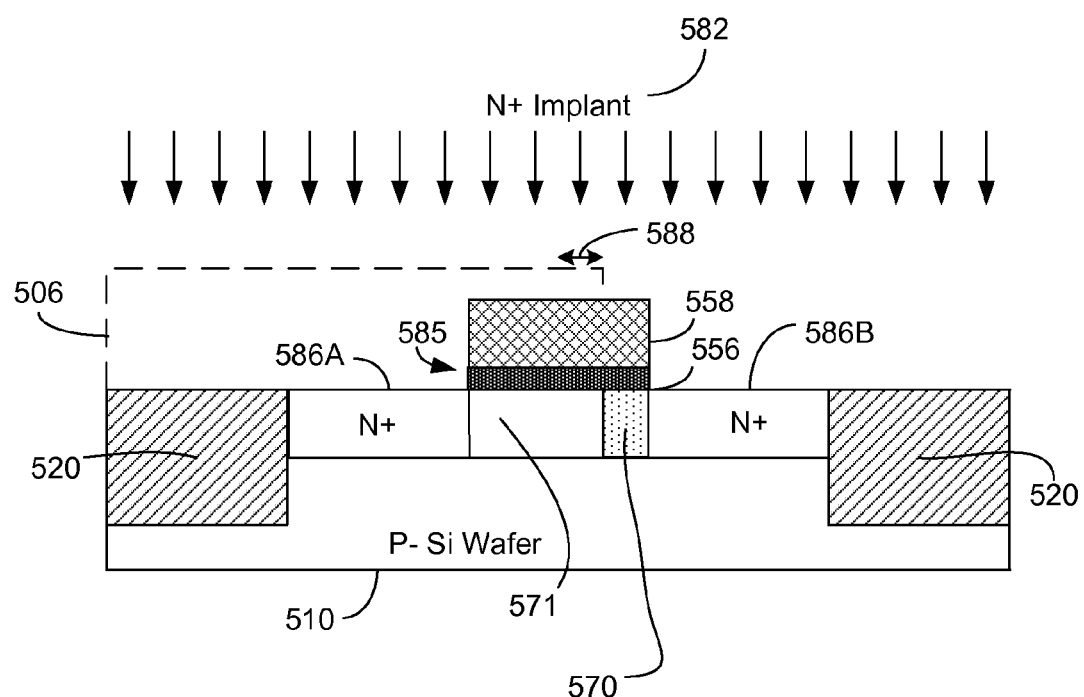

FIG. 5E illustrates an ion implant step similar to that shown in FIG. 5B, however in this figure, the ion implant mask used in an earlier step is misaligned (e.g., the etched away photoresist areas 506 defining the ion implant mask are shifted to the right, when compared with the photoresist areas shown previously in FIG. 5B). This is indicated by a misalignment indicator 588. As a result, a larger unmodified P-area 571 (i.e. an area that did not receive the light P dopant during the VT tailor ion implant) exists under the gate 585 next to the modified P-area 570. Thus, the voltage threshold of the gate 585 is reduced.

Figure 5F:
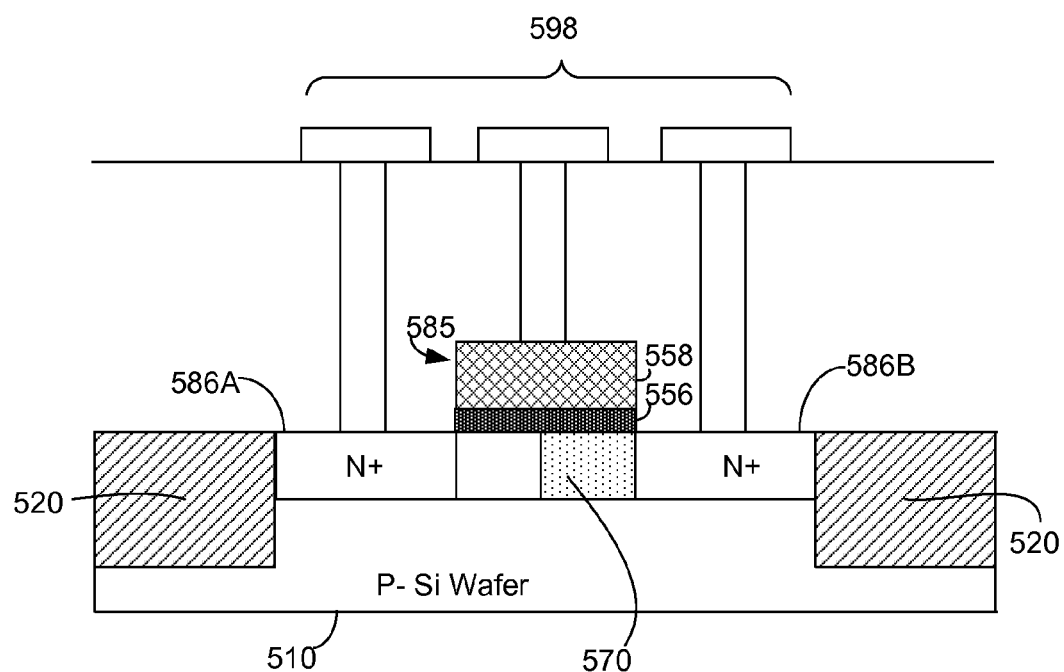

FIG. 5F illustrates a section of the PTU 390 connected to the FET in the MARB measurement unit. The PTU 390, using contacts 598 placed on the gate, source, and drain of the FET, measures threshold voltage to determine misalignment and bias.

Figure 6A:
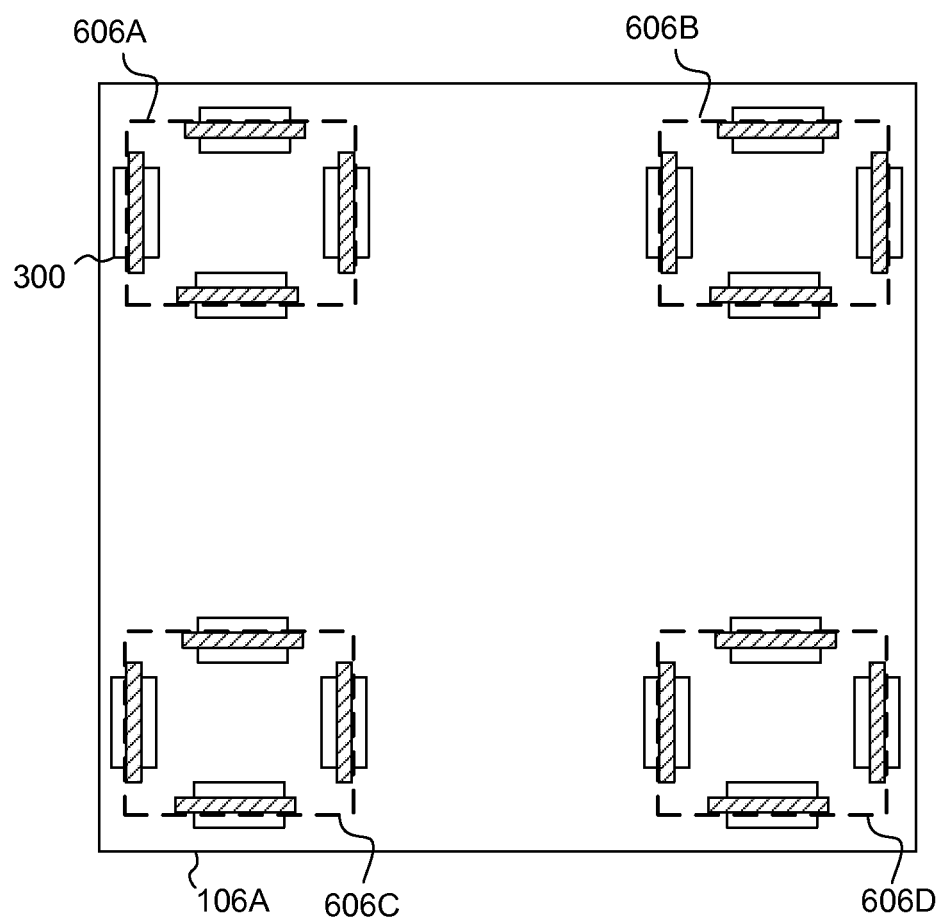
FIGS. 6A-6B illustrate an overhead view of a mask reticle designed to work in conjunction with the mask alignment, rotation and bias measurement unit.
Figure 6B:
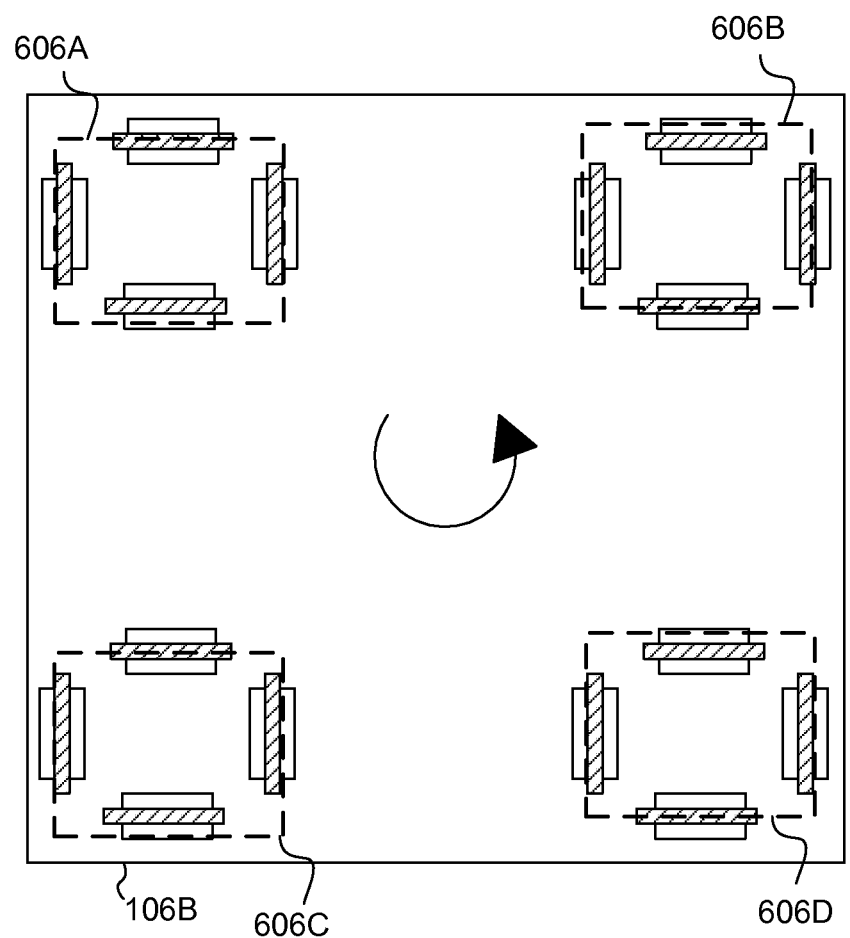

FIGS. 6A-6B illustrate overhead views of a mask reticle 106A with an ion implant mask 606A-606D at each corner of the mask reticle 106A. The ion implant mask 606A opens an image at each corner of the mask reticle that, once developed, exposes the interior sections of each MARB measurement unit 300 instance. If the mask reticle 106A is rotated out of position, as shown in FIG. 6B, each ion implant mask 606A shifts, leaving sections unexposed that should be exposed or vice versa. The shift results in a variation in gate threshold voltage across all MARB measurement unit instances, indicating a particular type of rotation. For example, if PTU 390 identifies that ion implant masks 606A and 606C are misaligned downward and 606B and 606D are misaligned upward, PTU 390 flags the mask reticle as having undergone a counter-clockwise rotation.

What is claimed is:

1. An apparatus for detecting ion implant mask misalignment, rotation and bias, comprising:
    at least two field effect transistor (FET) pairs;
    an ion implanted area in a gate region within each FET included in the at least two FET pairs; and
    at least one inspection unit coupled to the at least two FET pairs and configured to measure the threshold voltage of each FET included in the at least two FET pairs so that at least one of ion implant mask misalignment, rotation and bias can be detected on the basis of the measured threshold voltage of one or more FET included in the at least two FET pairs.

2. The apparatus of claim 1, wherein the at least one inspection unit is further configured to compare the measured threshold voltage of each FET included in the at least two FET pairs against a known reference threshold voltage.

3. The apparatus of claim 2, wherein the at least one inspection unit is configured to provide an indication of an undersized mask bias error when the measured threshold voltage of each FET included in the at least two FET pairs is higher than the known reference threshold voltage.

4. The apparatus of claim 2, wherein the at least one inspection unit is configured to provide an indication of an oversized mask bias error when the measured threshold voltage of each FET included in the at least two FET pairs is lower than the known reference threshold voltage.

5. The apparatus of claim 1, wherein the at least one inspection unit is configured to compare the measured threshold voltage of each FET of at least one FET pair chosen from the at least two FET pairs.

6. The apparatus of claim 5, wherein the at least one inspection unit is configured to provide an indication of a vertical mask alignment error when the at least one FET pair is vertically aligned, and when the measured threshold voltage of at least two of the FETs within the at least one FET pair is different.

7. The apparatus of claim 5, wherein the at least one inspection unit is configured to provide an indication of a horizontal mask alignment error when the at least one FET pair is horizontally aligned, and when the measured threshold voltage of at least two of the FETs within the at least one FET pair is different.

8. The apparatus of claim 1, wherein a mask alignment, rotation and bias (MARB) measurement unit having an instance of the at least two FET pairs and an inspection unit are positioned at each corner of a mask reticle.

9. The apparatus of claim 8, wherein each of the at least one inspection unit is configured to measure mask alignment errors.

10. The apparatus of claim 8, wherein the apparatus analyzes the direction of alignment errors provided by the at least one inspection unit in order to determine a mask rotation error, and the direction of the mask rotation.

11. A method for detecting ion implant mask misalignment, rotation and bias errors in semiconductor fabrication, comprising:
    positioning at least one mask alignment, rotation and bias (MARB) measurement unit having at least two field effect transistor (FET) pairs during semiconductor manufacturing such that a gate region within each FET receives ion dopants from an ion implant process; and
    measuring, via an inspection unit within the MARB, threshold voltages of each FET included in the at least two FET pairs;
    wherein the method is performed using an apparatus for detecting ion implant mask misalignment, rotation and bias, the apparatus comprising:
        the at least two field effect transistor (FET) pairs;
        an ion implanted area in the gate region within each FET included in the at least two FET pairs; and
        the at least one inspection unit coupled to the at least two FET pairs and configured to measure the threshold voltage of each FET included in the at least two FET pairs so that at least one of ion implant mask misalignment, rotation and bias can be detected on the basis of the measured threshold voltage of one or more FET included in the at least two FET pairs.

12. The method of claim 11, further comprising the step of: comparing the measured threshold voltage of each FET included in the at least two FET pairs against a known voltage reference.

13. The method of claim 12, further comprising the step of: providing an indication of an undersized mask bias error when the measured threshold voltage of each FET included in the at least two FET pairs is smaller than the known reference threshold voltage.

14. The method of claim 12, further comprising the step of: providing an indication of an oversized mask bias error when the measured threshold voltage of each FET included in the at least two FET pairs is higher than the known reference threshold voltage.

15. The method of claim 11, further comprising the step of: comparing the measured threshold voltage of each FET of the at least two FET pairs against each other.

16. The method of claim 15, further comprising the step of: providing an indication of a vertical mask error when at least one FET pair is vertically aligned, and when the measured threshold voltage of at least two of the FETs wherein the at least one FET pair are different.

17. The method of claim 15, further comprising the step of: providing an indication of a horizontal mask error when the at least one FET pair is horizontally aligned, and when the measured threshold voltage of at least two of the FETs within the at least one FET pair are different.

18. The method of claim 11, wherein the step of positioning the MARB measurement unit, further comprises:
    positioning a MARB measurement unit at each corner of a mask reticle.

19. The method of claim 18, further comprises:
    measuring mask alignment errors within each of the MARB measurement units.

20. The method of claim 19, the providing step further comprising:
    determining any mask rotation errors and the direction of the mask rotation by analyzing the mask alignment errors provided by each of the MARB measurement units.

* * * * *